US006320439B1

(12) United States Patent
Garbelli et al.

(10) Patent No.: US 6,320,439 B1
(45) Date of Patent: Nov. 20, 2001

(54) METHOD AND CIRCUIT OF SOFT START AND OF POWER MONITOR FOR IC WITH MULTIPLE SUPPLIES

(75) Inventors: Luigi Eugenio Garbelli, Mapello; Giuseppe Luciano, Brugherio; Salvatore Portaluri, Pavia, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/657,436

(22) Filed: Sep. 7, 2000

(30) Foreign Application Priority Data

Sep. 8, 1999 (EP) ............................................... 99830559

(51) Int. Cl.[7] ....................................................... H03K 3/02
(52) U.S. Cl. ........................................................... 327/198
(58) Field of Search .................................... 327/142, 143, 327/198

(56) References Cited

U.S. PATENT DOCUMENTS 5,063,303 11/1991 Sackman et al. ................. 307/296.1
5,264,782 11/1993 Newton ................................ 323/288
5,710,701 1/1998 Brown .................................. 364/185
6,084,389 * 7/2000 Gens et al. ........................... 323/315

FOREIGN PATENT DOCUMENTS 871037 10/1998 (EP) .............................. G01R/31/40
709949 5/1996 (EP) .............................. H02M/3/335

* cited by examiner

*Primary Examiner*—Jeffrey Zweizig
(74) *Attorney, Agent, or Firm*—Theodore E. Galanthay; Allen, Dyer, Doppelt, Milbrath & Gilchrist, P.A.

(57) ABSTRACT

The monitoring of multiple supply voltages of an integrated circuit is done using a single external capacitor connected to a pin of the integrated circuit. Part of the multiple supply voltages are externally generated and part are internally generated. The internally generated supply voltages may include different voltages with different signs. A logic signal indicating that all the supply voltages have reached pre-established values before enabling functioning of the integrated circuit is generated after an initial soft start phase of the turn-on process.

26 Claims, 3 Drawing Sheets

METHOD AND CIRCUIT OF SOFT START AND OF POWER MONITOR FOR IC WITH MULTIPLE SUPPLIES

FIELD OF THE INVENTION

The present invention relates to integrated digital circuits, and, more particularly, to a procedure for monitoring all the power supplies within an integrated circuit (IC). This monitoring is a function referred to as power monitoring.

BACKGROUND OF THE INVENTION

Integrated systems tend to have several subsystems and power sections integrated on a single chip. These devices commonly use different positive power supplies, and often use negative power supplies to power in the most efficient manner the different chip sections or the various subsystems integrated on the same chip.

Sometimes one or more supply voltage sources are externally provided, while others are implemented internally by as many voltage regulators as there are externally generated supply voltages. In these monolithic integrated complex systems, it is very important to monitor the level of all the different supply voltages and to generate a so-called NPOR signal stating their compliance or noncompliance with their respective design values.

For an integrated system with one or more regulators generating as many supply voltages within the integrated circuit, it may be crucial to verify that all the supply voltages that are either fed to the IC or generated internally have reached pre-established values before enabling functioning of the integrated circuit.

Conventionally, this verification is acknowledged at the end of the charging process via a capacitor charged with a relatively low constant current to prevent the functional circuits from producing false switchings because of an insufficient supply voltage at the turn-on of the IC. Because the capacitor must be charged within a few milliseconds, it must have a relatively high capacitive value. This capacitor is commonly an external capacitor connected to a dedicated pin of the IC.

The assertion that all the supplies of the functional circuits of the integrated circuit have reached their pre-established values is done conventionally by forcing the NPOR signal to a high logic level. On the other hand, many electronic systems implement a turn-on method that is commonly referred to as soft start to avoid an abrupt application of the full supply voltages to the IC. Even for this well known soft start function, a relatively slow charging external capacitor having a large capacitance is the common way of implementation.

It is evident the burden implied by the use of distinct external capacitors, one for the soft start function and the other for the power monitor function. Each capacitor respectively requires a dedicated pin on the IC.

SUMMARY OF THE INVENTION

In view of the foregoing background, an object of the present invention is to provide a method and a power monitor circuit for generating a NPOR signal representing the state of the power supplies while using a single external capacitor. This external capacitor is charged with a constant current from a suitable current generator integrated in the device that is used to implement a soft start function of the IC.

This and other objects, advantages and features are provided by a method comprising disabling of a first discharge path of the external capacitor when the presence of the externally provided supply voltage(s) is acknowledged allowing the start of the external capacitor charge ramp towards a certain regulated voltage.

At least a first replica of the charge ramp is generated, and optionally an inverted second replica of the charge ramp is generated. The replicated voltage ramps are respectively supplied to the regulators that generate positive supply voltages and to the regulators that generate negative supply voltages, respectively for activating the soft start.

The method further includes monitoring a signal of assertion that the values of all the externally provided and internally generated supply voltages are correct. Continuation or interruption is conditioned for charging the external capacitor towards the regulated charge voltage for overcoming a first pre-established level of the charge voltage on the external capacitor. This coincides with the end of the soft start procedure by keeping disabled or enabled a second discharge path of the external capacitor until the assertion signal is raised.

The end of the turn-on procedure is established by charging the capacitor to a second pre-established voltage which causes a transition from low to high of the NPOR signal. The NPOR signal will remain high as long the signal of assertion is absent for a period of time greater than a pre-established minimum time interval.

BRIEF DESCRIPTION OF THE DRAWINGS

FIG. 1 is a sequence of diagrams depicting the turn-on procedure for a positive verification of the internally generated supply voltages according to the present invention;

DETAILED DESCRIPTION OF THE PREFERRED EMBODIMENTS

The system of the present invention has been successfully tested in an integrated circuit (IC) having a plurality of regulators therein. In a sample device, a first supply voltage 12V and a second supply voltage 5V are applied to respective pins from external sources. A third supply voltage 3.3V is generated internally and powers a regulator generating a fourth regulated supply voltage 2.5V and a regulator generating a fifth negative supply voltage −5V.

Figure 7:
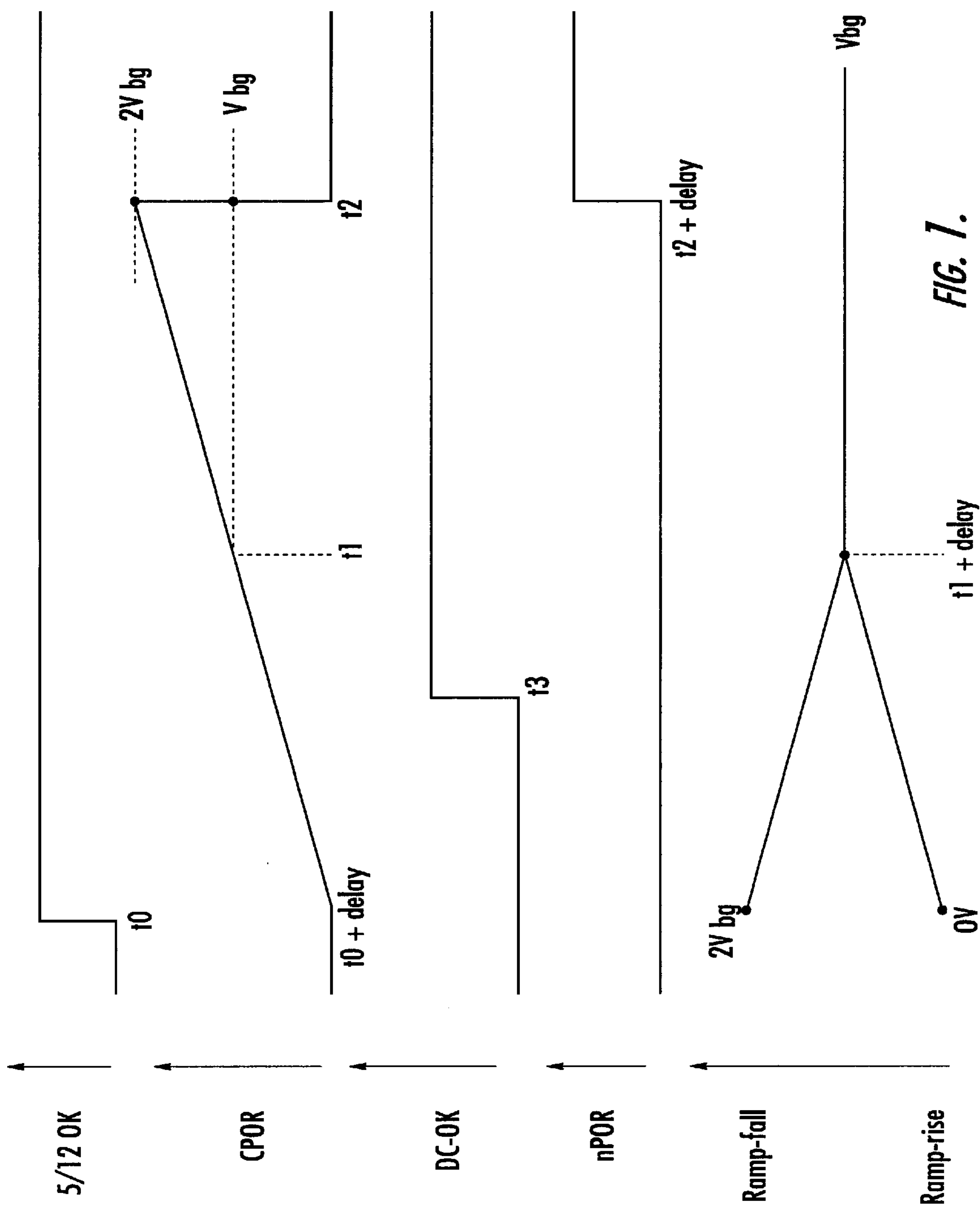
Figure 2:
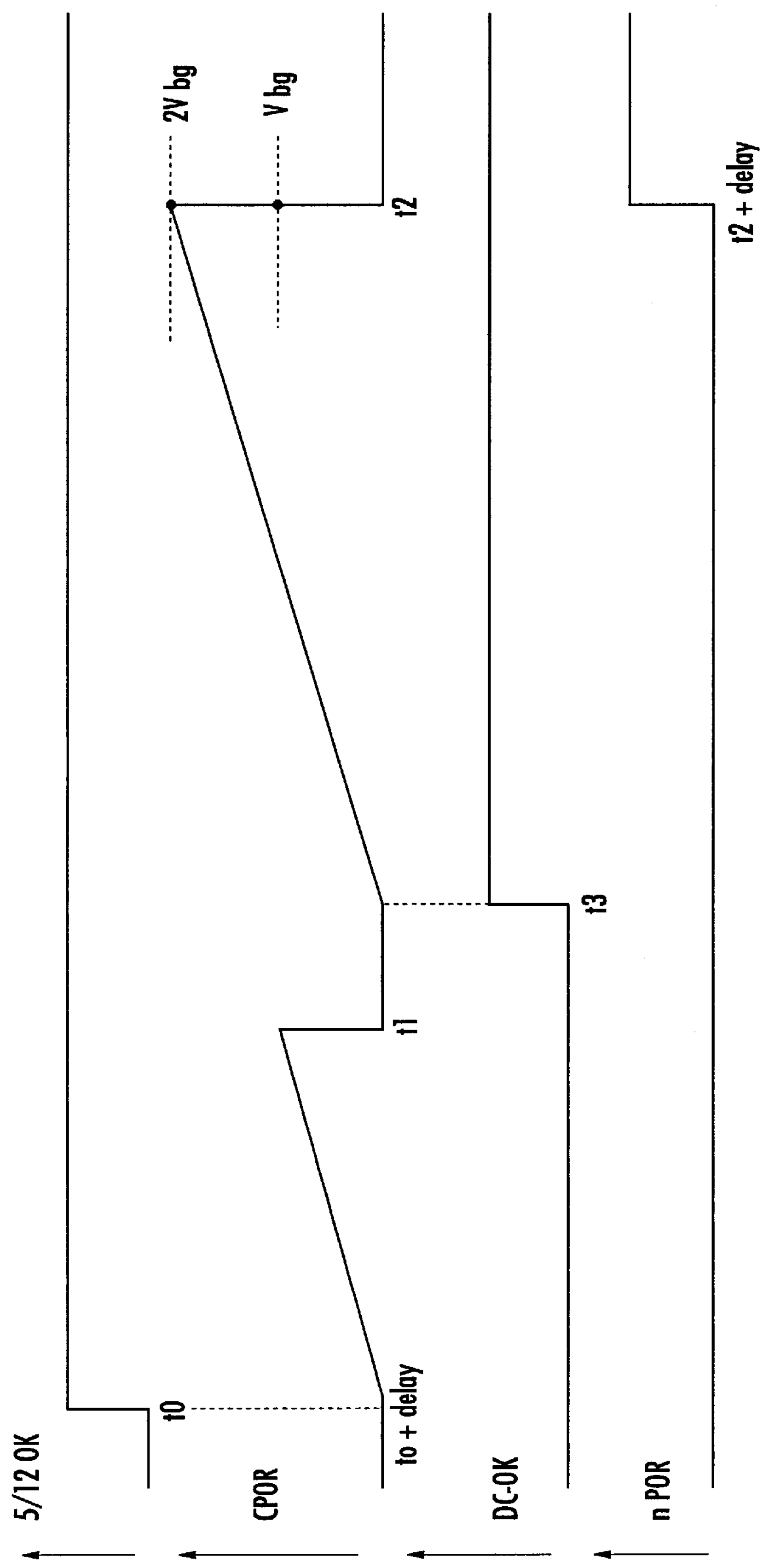
FIG. 2 is a sequence of diagrams depicting the turn-on procedure for a negative verification of the internally generated supply voltages according to the present invention.
Figure 3:
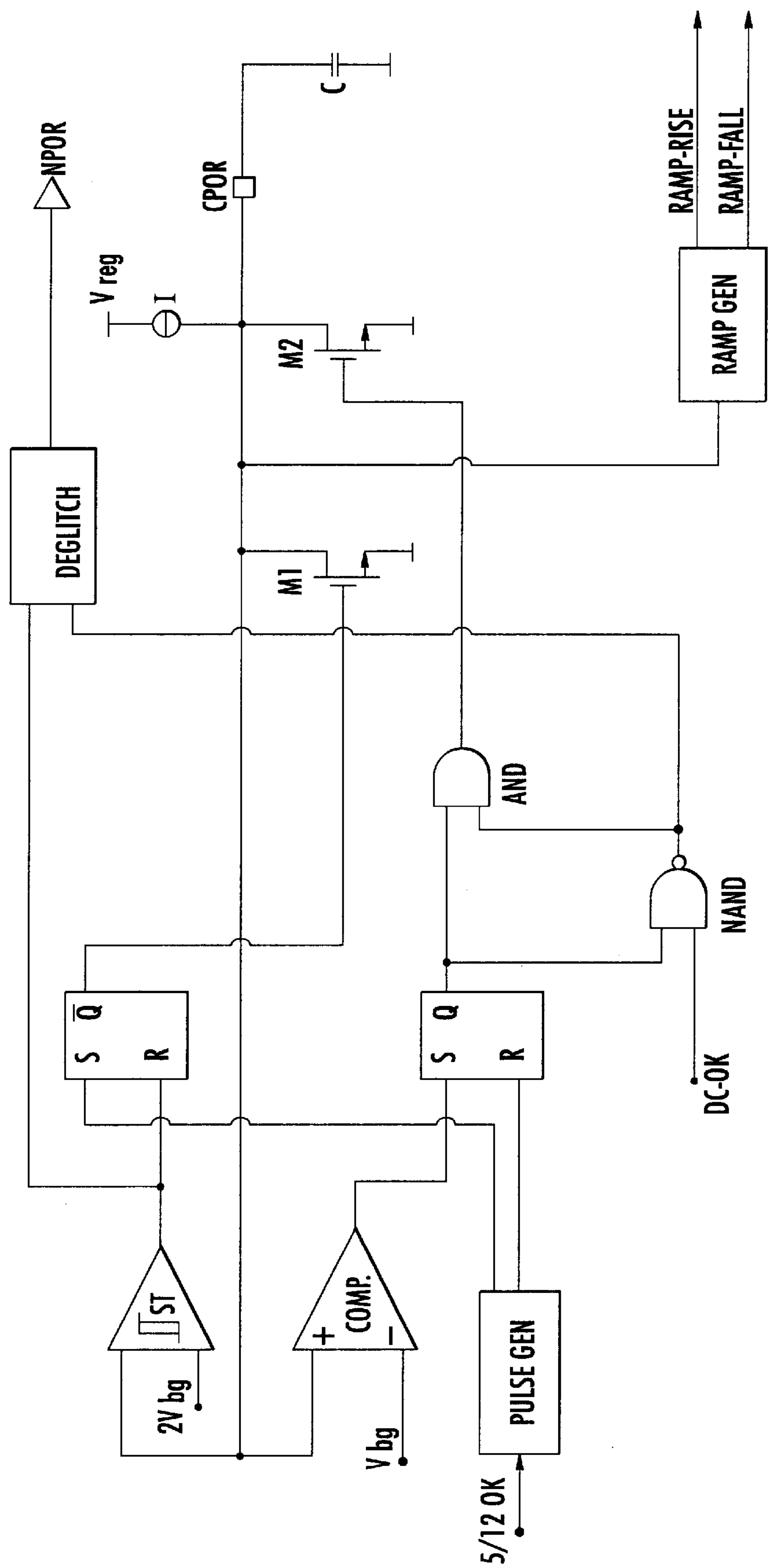
FIG. 3 is a basic block diagram for implementing the method according to the present invention.

The basic diagram of a circuit according to the present invention is depicted in FIG. 3. FIGS. 1 and 2 illustrate a sequence of diagrams (corresponding to an algorithm) depicting the turn-on procedures for two different situations that may occur at the turn-on of the IC.

Referring to the diagram of FIG. 3, both the soft start function and the power monitor function are implemented according to the present invention via a single external capacitor C. The use of a single external capacitor requires only one pin of the IC. The capacitor C is charged by the current generator I towards a certain voltage, which is indicated as Vreg. At turn-on, the transistor M1 is biased in a conduction state so that the external capacitor C maintains in a discharged state.

Upon the rising of a first logic signal 5/12ok indicating application of the externally provided supply voltages to the device, the block PULSE GEN sets the flip-flop FF1. The output of FF1 is coupled to the control node of the transistor M1, causing it to turn-off. The PULSE GEN block, besides setting the flip-flop FF1, also resets the flip-flop FF2. The output Q of the flip-flop FF2 is coupled to an input of an AND gate. The output of the AND gate is coupled to the control terminal of a second transistor M2 for keeping it in an off state. The second transistor M2 is connected in parallel to the external capacitor C.

The correct application of the externally provided supplies (5V and 12V) to the IC is acknowledged at the instant $t_0$. This is when the external capacitor C starts charging towards Vreg with a constant current established by the charge current generator I. The voltage on the external capacitor C is applied as an input to the block RAMP GEN. The block RAMP GEN generates a direct replica and, eventually, a second replica of the charge ramp of the voltage on the external capacitor C whose level is shifted and whose sign is inverted.

The two generated ramps are referred to as RAMP_RISE and RAMP_FALL, and implement the soft start of the internal regulators. The initial soft start interval ends when a certain pre-established voltage of an intermediate value is reached on the external capacitor C. This pre-established voltage is typically the band-gap voltage Vbg.

In the illustrated example, the generator RAMP GEN generates a first ramp RAMP_RISE that is substantially a replica of the voltage ramp developing on the external capacitor C. A value of this first ramp extends from zero up to the value of the band-gap voltage Vbg. The generator RAMP GEN also generates a second ramp RAMP_FALL falling from a shifted level of 2*Vbg down to the Vbg level.

The soft start interval ends when the voltage on the capacitor C attains the value Vbg. This event is sensed by the comparator COMP at the instant $t_1$. The output of the comparator COMP sets the second flip-flop FF2 with a minimum delay ($t_1$+delay). At this point, the power monitor algorithm of the invention discriminates between two distinct situations that may occur at the instant $t_1$ or, more precisely, at the instant $t_1$ plus a minimum switching delay of the comparator COMP which establishes the end of the soft start.

A second signal or flag DC_ok is produced in a conventional manner in the IC to assert or deny the condition that all the externally provided supply voltages (5V and 12V) and the internally generated supply voltages (3.3V, 2.5V and −5V) have a correct value. This second assertion signal DC_ok is applied to a first input of a NAND gate. The second input of the NAND gate is coupled to the output Q of the second flip-flop FF2. The output of the NAND gate is coupled to a second input of an inverting AND gate whose output controls the second transistor M2.

If at the instant $t_1$ plus the switching delay of the comparator COMP, and if the signal DC_ok is high confirming the correct positioning on the respective design values of all the supplies in the IC, the transistor M2 is kept in a cut-off state. This allows the charge ramp of the capacitor C to continue until a second pre-established level is eventually reached. The second pre-established level is commonly a multiple of Vbg, such as 2*Vbg in the illustrated example.

The second threshold is sufficiently high to cause the triggering of the Schmitt trigger ST whose output turns on the transistor M1 by resetting the first flip-flop FF1. The transistor M1 immediately discharges the external capacitor C which ends the turn-on process, and the enablement of the power monitor function by forcing the NPOR output to a high logic level.

The block DEGLITCH has the function of masking undue transitions of the NPOR signal during the normal operation of the IC that may occur because of spurious switchings of the DC_ok signal. The signal DC_ok may have an infinitesimal duration which may be caused by accidental transients, noise coming from the main power supply, etc.

The output of the NAND gate is applied to an input of the block DEGLITCH which discriminates the duration of eventual switchings from the high to low state of the signal DC_ok. This filters out spurious switchings having a duration shorter than a minimum re-established time interval.

The two different situations that may occur during a turn-on process of the IC are shown in FIGS. 1 and 2. By accidental reasons, it may happen that at the instant $t_1$, the signal DC_ok has not yet been asserted, i.e., has not yet switched from a low to a high level. In this case, the transistor M2, which discharges the external capacitor C, is forced in a conducting state because of the switching of the comparator COMP. Thus, the external capacitor C is kept discharged until the signal DC_ok switches to a high logic level at the instant $t_3$. This causes the turning-off of the transistor M2 and starts anew the charge ramp voltage for the external capacitor C.

As may be observed, the stated objective is fully accomplished, with the soft start and power monitor requirements being satisfied by the system disclosed herein which uses a single external capacitor C.

That which is claimed is:

1. A method for monitoring multiple supply voltages in an integrated circuit, the multiple supply voltages being externally and internally generated, the method comprising:

disabling a first discharge path of an external capacitor connected to a pin of the integrated circuit for allowing start of a charge ramp signal towards a voltage reference for the external capacitor, the disabling being based upon a first signal indicating that the externally generated supply voltages are correct in value;

generating at least a first replica signal of the charge ramp signal for at least one internal supply voltage generator for implementing a soft start phase of a turn-on process for the integrated circuit;

monitoring presence of a second signal indicating that the externally and internally generated supply voltages are correct in value, and regulating the charge ramp signal to an intermediate voltage value with respect to a value of the voltage reference;

enabling a second discharge path of the external capacitor based upon the second signal so that regulation of the charge ramp signal coincides with an end of the soft start phase;

generating a logic signal based upon a second voltage value being applied to the external capacitor via the charge ramp signal, the logic signal indicating that the externally and internally generated supply voltages are correct in value after the soft start phase of the turn-on process; and enabling the first discharge path ending the turn-on process.

2. A method according to claim 1, wherein the logic signal is generated as long as the second signal remains absent longer than a minimum time interval.

3. A method according to claim 1, wherein generating at least the first replica signal further comprises:

generating a second replica signal that is an inverted and level shifted replica of the charge ramp signal; and generating a supply voltage signal based upon the second replica signal, the supply voltage signal having a sign opposite a sign of the externally generated supply voltages.

4. A method according to claim 1, wherein the charge ramp signal changes at a constant current.

5. A method according to claim 1, wherein the intermediate value of the voltage reference corresponds to a value of a bandgap voltage.

6. A method according to claim 5, wherein the second voltage value corresponds to about two times the value of the bandgap voltage.

7. A method for monitoring multiple supply voltages in an integrated circuit, the method comprising:

disabling a first discharge path of an external capacitor connected to a pin of the integrated circuit for allowing start of a charge ramp signal towards a voltage reference;

implementing a soft start phase of a turn-on process for the integrated circuit;

regulating the charge ramp signal to an intermediate voltage value with respect to a value of the voltage reference;

enabling a second discharge path of the external capacitor so that regulation of the charge ramp signal coincides with an end of the soft start phase; and generating a logic signal based upon a second voltage value being applied to the external capacitor via the charge ramp signal, the logic signal indicating that the externally and internally generated supply voltages are correct in value after the soft start phase of the turn-on process.

8. A method according to claim 7, further comprising enabling the first discharge path ending the turn-on process.

9. A method according to claim 7, further comprising generating at least a first replica signal of the charge ramp signal for at least one internal voltage supply generator for implementing the soft start phase.

10. A method according to claim 9, wherein generating at least the first replica signal further comprises:

generating a second replica signal that is an inverted and level shifted replica of the charge ramp signal; and generating a supply voltage signal based upon the second replica signal, the supply voltage signal having a sign opposite a sign of the externally generated supply voltages.

11. A method according to claim 7, wherein disabling the first discharge path is based upon a first signal indicating that the externally generated supply voltages are correct in value.

12. A method according to claim 7, further comprising monitoring presence of a second signal indicating that the externally and internally generated supply voltages are correct in value; and wherein enabling the second discharge path is based upon the second signal.

13. A method according to claim 12, wherein the logic signal is generated as long as the second signal remains absent longer than a minimum time interval.

14. A method according to claim 7, wherein the charge ramp signal changes at a constant current.

15. A method according to claim 7, wherein the intermediate value of the voltage reference corresponds to a value of a bandgap voltage.

16. A method according to claim 15, wherein the second voltage value corresponds to about two times the value of the bandgap voltage.

17. An integrated circuit comprising:

a plurality of external pins comprising at least one external capacitor pin for connection to an external capacitor; and a monitoring circuit for monitoring multiple supply voltages being externally and internally generated, said monitoring circuit comprising a first discharge path connected to said at least one external capacitor pin for allowing start of a charge ramp signal towards a value of a voltage reference when said first discharge path is disabled, a first circuit connected to said first discharge path for implementing a soft start phase of a turn-on process of the integrated circuit, a second discharge path connected to said at least one external capacitor pin, a regulation circuit connected to said second discharge path for regulating the charge ramp signal to an intermediate voltage value with respect to the value of the voltage reference, said second discharge path being disabled or enabled so that regulation of the charge ramp signal coincides with an end of the soft start phase, and a second circuit connected to said regulation circuit for generating the logic signal based upon a second voltage value being applied to said at least one external capacitor pin via the charge ramp signal, the logic signal indicating that the externally and internally generated supply voltages are correct in value after the soft start phase of the turn-on process.

18. A circuit according to claim 17, further comprising an enabling circuit for enabling said first discharge path ending the turn-on process.

19. A circuit according to claim 17, further comprising:

a ramp generator connected to said first discharge path for generating at least a first replica signal of the charge ramp signal; and at least one voltage supply generator connected to said ramp generator for implementing the soft start phase based upon the generated first replica signal.

20. A circuit according to claim 17, further comprising a pulse generator having an input for receiving a first signal indicating that the externally generated supply voltages are correct in value; and wherein said first discharge path is disabled based upon the first signal.

21. A circuit according to claim 20, further comprising a first register having a first input connected to an output of said pulse generator, and an output connected to said first discharge path.

22. A circuit according to claim 20, further comprising a second register having a first input connected to an output of said pulse generator, and an output connected to said second discharge path for disabling said second discharge path based upon a second signal, the second signal indicating that the externally and internally generated supply voltages are correct in value.

23. A circuit according to claim 22, further comprising a first comparator having an output connected to a second input of said second register, a first input for receiving the voltage reference, and a second input connected to said at least one external capacitor pin.

24. A circuit according to claim 21, further comprising a second comparator having an output connected to a second input of said first register and to said second circuit, a first input for receiving twice the voltage reference, and a second input connected to said external capacitor.

25. A circuit according to claim 24, wherein said second comparator comprises a hysteresis comparator; and said logic circuit generating the logic signal based upon switching of said hysteresis comparator.

26. A circuit according to claim 17, wherein said first discharge path comprises a first transistor, and wherein said second discharge path comprises a second transistor connected in parallel to said first transistor.

* * * * *